(12) United States Patent
Yamagishi

(10) Patent No.: US 11,996,306 B2
(45) Date of Patent: May 28, 2024

(54) COUPLED PROCESSING CONTAINERS, SUBSTRATE PROCESSING SYSTEM, AND SUBSTRATE PROCESSING METHOD

(71) Applicant: TOKYO ELECTRON LIMITED, Tokyo (JP)

(72) Inventor: Takayuki Yamagishi, Tokyo (JP)

(73) Assignee: TOKYO ELECTRON LIMITED, Tokyo (JP)

(*) Notice: Subject to any disclaimer, the term of this patent is extended or adjusted under 35 U.S.C. 154(b) by 174 days.

(21) Appl. No.: 17/316,312

(22) Filed: May 10, 2021

(65) Prior Publication Data

US 2021/0366736 A1 Nov. 25, 2021

(30) Foreign Application Priority Data

May 20, 2020 (JP) .................. 2020-088333

(51) Int. Cl.
*H01L 21/67* (2006.01)

(52) U.S. Cl.
CPC .... *H01L 21/6719* (2013.01); *H01L 21/67167* (2013.01)

(58) Field of Classification Search
CPC ......... H01L 21/67; H01L 21/68; A47B 45/00; F16M 11/00
USPC ....................................................... 211/207
See application file for complete search history.

(56) References Cited

U.S. PATENT DOCUMENTS

2014/0017055 A1* 1/2014 Li .................... G11B 17/00
414/744.8

FOREIGN PATENT DOCUMENTS

| JP | 2010-199517 A | 9/2010 | |
| JP | 2017-69314 A | 4/2017 | |
| JP | 2017-183495 A | 10/2017 | |
| KR | 10-2009-0017887 A | 2/2009 | |
| KR | 10-2010-0064802 A | 6/2010 | |
| WO | WO2021188109 * | 9/2021 | .......... A47B 96/07 |

* cited by examiner

*Primary Examiner* — Ronald P Jarrett
(74) *Attorney, Agent, or Firm* — Nath, Goldberg & Meyer; Jerald L. Meyer; Tanya E. Harkins

(57) ABSTRACT

Coupled processing containers include a first processing container and a second processing container provided side by side in a horizontal direction to form a gap therebetween, the first processing container and the second processing container being configured to store substrates, respectively, in order to perform vacuum processing, and a connecting part provided across the gap so as to connect the first processing container and the second processing container to each other, the connecting part being configured to be slidable in the horizontal direction with respect to at least one of the first processing container and the second processing container.

17 Claims, 12 Drawing Sheets

COUPLED PROCESSING CONTAINERS, SUBSTRATE PROCESSING SYSTEM, AND SUBSTRATE PROCESSING METHOD

CROSS-REFERENCE TO RELATED APPLICATION

This application is based upon and claims the benefit of priority from Japanese Patent Application No. 2020-088333, filed on May 20, 2020, the entire contents of which are incorporated herein by reference.

TECHNICAL FIELD

The present disclosure relates to coupled processing containers, a substrate processing system, and a substrate processing method.

BACKGROUND

In a semiconductor device manufacturing process, a semiconductor wafer (hereinafter, referred to as a "wafer"), which is a substrate, is stored in a processing container, and a film forming process, an etching process, or the like accompanied by heating is performed. Patent Document 1 describes a substrate processing apparatus including a vacuum transport chamber 140 including a robot 170 configured to transport a wafer 200, and a large number of chambers 202 connected to the vacuum transport chamber 140 and configured to process the wafer 200 by heating and supplying a processing gas. Among the large number of chambers 202, two chambers 202 are connected such that side walls thereof are shared with each other, and the robot 170 delivers wafers 200 collectively to the two chambers 202 having such shared side walls.

PRIOR ART DOCUMENT

Patent Document

Patent Document 1: Japanese Laid-Open Patent Publication No. 2017-69314

SUMMARY

According to one aspect of the present disclosure, coupled processing containers include a first processing container and a second processing container provided side by side in a horizontal direction to form a gap therebetween, the first processing container and the second processing container being configured to store substrates, respectively, to perform vacuum processing, and a connecting part provided across the gap so as to connect the first processing container and the second processing container to each other, the connecting part being configured to be slidable in the horizontal direction with respect to at least one of the first processing container and the second processing container.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

Figure 1:
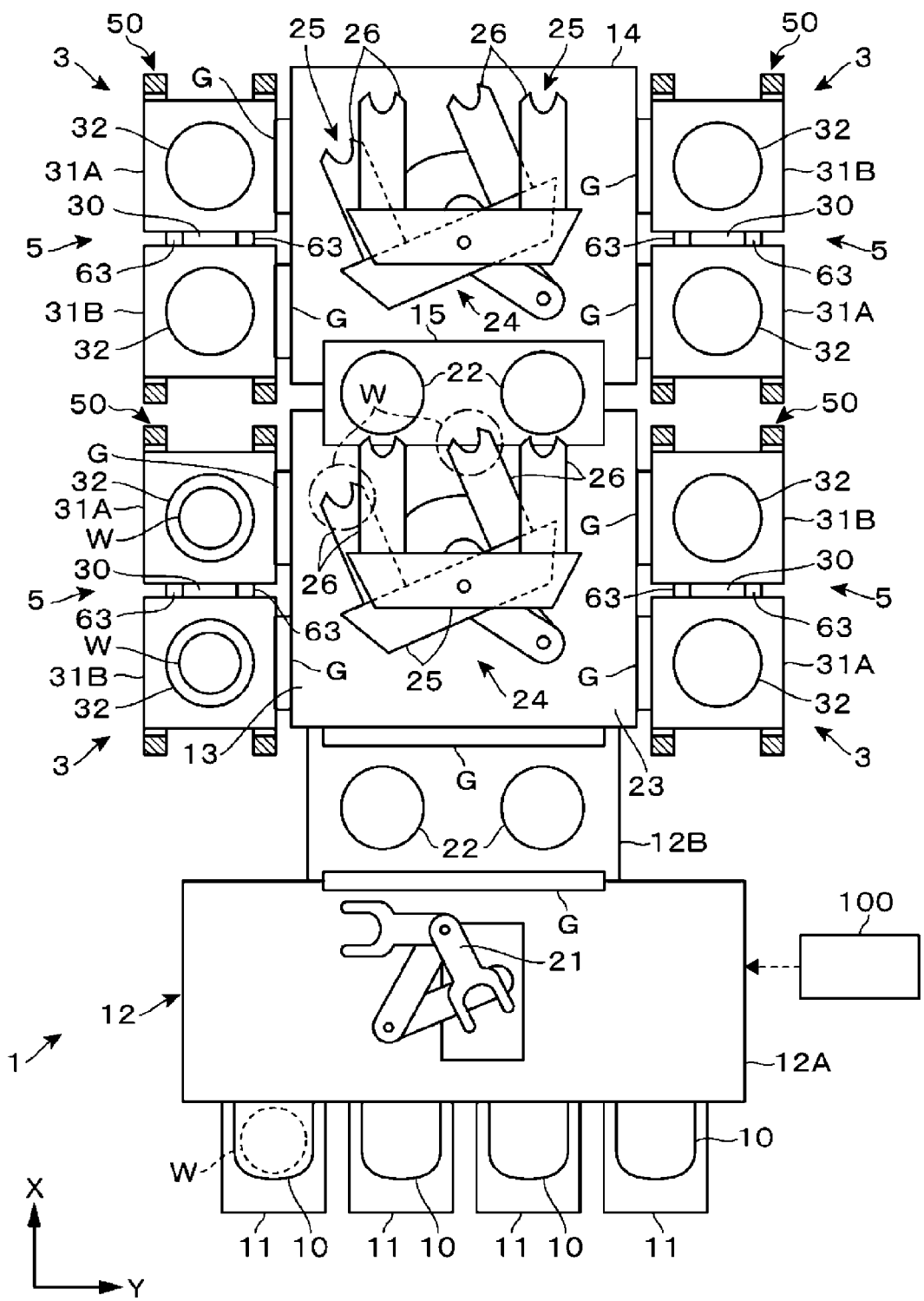
FIG. 1 is a plan view of a substrate processing system according to a first embodiment of the present disclosure.

A substrate processing system 1 in which coupled processing containers 5 according to a first embodiment of the present disclosure is applied will be described with reference to the plan view of FIG. 1. First, an outline of the substrate processing system 1 will be described. The substrate processing system 1 includes loading/unloading ports 11, a loading/unloading module 12, vacuum transport modules 13 and 14, a connection module 15, and film forming modules 3, and wafers W, which are circular substrates, are transported between respective modules and are subjected to a film forming process in respective modules. Four film forming modules 3 are provided, and each of the film forming modules 3 includes coupled processing containers 5. The coupled processing containers 5 include processing containers 31A and 31B, which are provided side by side in a left-right direction, that is, a horizontal direction, and are connected to each other, and each of the processing containers 31A and 31B accommodates one wafer W. The inside of each of the processing containers 31A and 31B has a vacuum atmosphere, and is supplied with a processing gas so as to form, for example, a titanium nitride (TiN) film on the surface of the wafer W.

A transport mechanism provided in the substrate processing system 1 transports wafers W collectively into the processing containers 31A and 31B constituting the same coupled processing containers 5. The two wafers W transported into the processing containers 31A and 31B in this way are subjected to a film forming process collectively under the same processing conditions.

Hereinafter, each part of the substrate processing system 1 will be described in detail. Four loading/unloading ports 11 are provided side by side in a straight line in the horizontal direction, and are connected to a loading/unloading module 12 provided on the side of the loading/unloading ports 11. Hereinafter, a connection direction between the loading/unloading ports 11 and the loading/unloading module 12 is referred to as an X direction, and an arrangement direction of the loading/unloading ports 11 is referred to as a Y direction. The X and Y directions are orthogonal to each other. Although the direction in which the processing containers 31A and 31B are arranged is described as a left-right direction, the X direction coincides with the left-right direction.

Along the X direction, the loading/unloading ports 11, the loading/unloading module 12, the vacuum transport module 13, the connection module 15, and the vacuum transport module 14 are provided and connected to each other in that order. Two film forming modules 3 are arranged with the vacuum transport module 13 being interposed therebetween in the Y direction, and each of the two film forming modules 3 is connected to the vacuum transport module 13. In addition, the remaining two film forming modules 3 are arranged with the vacuum transport module 14 being interposed therebetween in the Y direction, and each of the two film forming modules 3 is connected to the vacuum transport module 14.

Each loading/unloading port 11 described above constitutes a stage on which a transport container 10 for accommodating a wafer W is placed. The loading/unloading module 12 is a module for loading/unloading a wafer W to/from each transport container 10, and includes a normal pressure transport chamber 12A and a load lock chamber 12B. The normal pressure transport chamber 12A has an atmospheric atmosphere, and is provided with a transport mechanism 21, which is a coupled arm that is capable of being raised and lowered in order to deliver a wafer W between each transport container 10 and the load lock chamber 12B. The load lock chamber 12B is configured such that the atmosphere in which a wafer W is placed can be switched between an atmospheric atmosphere and a vacuum atmosphere, and includes two stages 22 arranged in the Y direction. The transport mechanism 21 of the normal pressure transport chamber 12A transports wafers W between the two stages 22 and a transport container 10, and delivers the wafers W to the two stages 22 one by one.

The vacuum transport modules 13 and 14 are configured similarly. The vacuum transport module 13 will be representatively described. The vacuum transport module 13 includes a vacuum transport chamber 23 in which a vacuum atmosphere is formed, and the vacuum transport chamber 23 is provided with a transport mechanism 24. The transport mechanism 24 is constituted with a coupled arm that is capable of being raised and lowered, and an end effector 25, which forms a tip of the coupled arm, includes two holding parts 26, which are formed to be spaced apart from each other. By holding one wafer W in each holding part 26, the transport mechanism 24 is capable of transporting two wafers W collectively, with a predetermined interval therebetween in the horizontal direction. For example, two end effectors 25 are provided to be vertically spaced apart from each other, and are configured such that one end effector 25 is capable of receiving wafers W from a module and the other end effector 25 is capable of sending the wafer W to the module.

The connection module 15 is a module on which wafers W are placed in order to deliver the wafers W between the vacuum transport modules 13 and 14, and the inside of the connection module 15 has a vacuum atmosphere. The connection module 15 is provided with two stages 22 arranged in the Y direction similarly to the load lock chamber 12B. The distance between the two stages 22 in each of the load lock chamber 12B and the connection module 15 corresponds to the distance between the holding parts 26 of the transport mechanism 24 such that collective delivery can be performed by the transport mechanism 24. The stages 22 have a configuration including, for example, substrate support parts (e.g., pins) that are separated from the centers of respective wafers W and support the wafers W at multiple positions spaced apart from each other in respective circumferential directions of the wafers W so that the wafers W can be delivered by the lifting operation of the transport mechanisms 21 and 24.

Gate valves G are respectively interposed between the normal pressure transport chamber 12A and the load lock chamber 12B, between the load lock chamber 12B and the vacuum transport module 13, and between the processing containers 31A and 31B constituting the film forming module 3 and the vacuum transport modules 13 and 14. A gate valve G opens and closes the transport port provided in each module, and the atmosphere in each module is maintained in the above-mentioned atmosphere.

In the substrate processing system 1 described above, a wafer W is transported from a transport container 10 to a film forming module 3 connected to the vacuum transport module 13 or the vacuum transport module 14, processed, and then returned to the transport container 10. Therefore, as one transport path, a wafer W is transported in the following order: a transport container 10→the normal pressure transport chamber 12A→the load lock chamber 12B→the vacuum transport module 13→a film forming module 3→the vacuum transport module 13→the load lock chamber 12B→the normal pressure transport chamber 12A→the transport container 10. As another transport path, a wafer W is transported in the following order: a transport container 10→the normal pressure transfer chamber 12A→the load lock chamber 12B→the vacuum transport module 13→the connection module 15→the vacuum transport module 14→a film forming module 3. Thereafter, the wafer is transported from the film forming module 3 in the following order: the vacuum transport module 14→the connection module 15→the vacuum transport module 13→the load lock chamber 12B→the normal pressure transport chamber 12A→the transport container 10.

For each of the transport paths described above, two wafers W are transported collectively in a section in which the transport mechanism 24 performs transport. Therefore, two wafers W are transported collectively between a film forming module 3 including processing containers 31A and 31B and a vacuum transport module 13 or 14. In addition, two wafers W are also transported collectively between the load lock chamber 12B and the vacuum transport module 13, between the vacuum transport module 13 and the connection module 15, and between the connection module 15 and the vacuum transport module 14.

Figure 2:
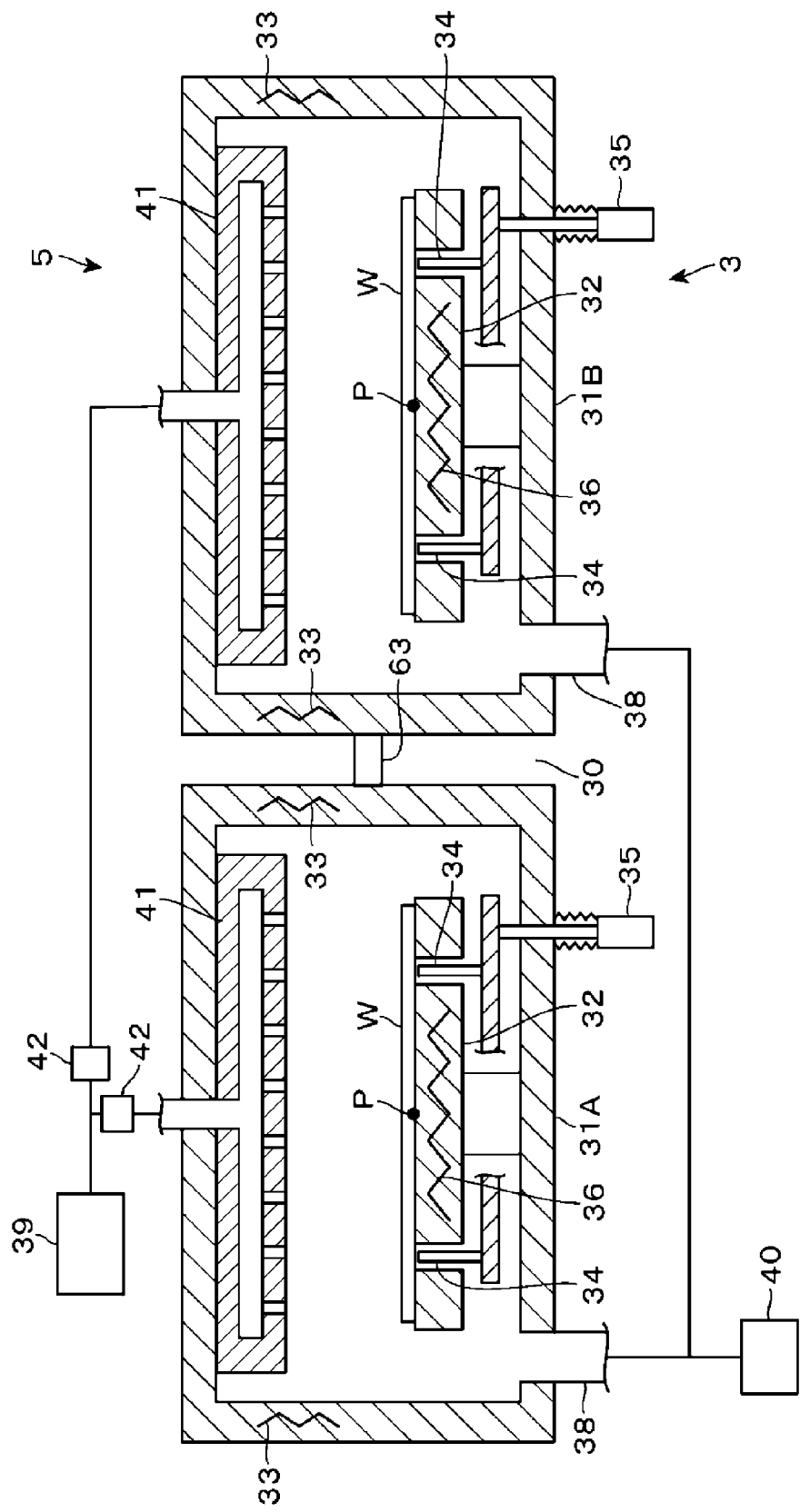
FIG. 2 is a vertical cross-sectional side view of coupled processing containers provided in the substrate processing system.

Each film forming module 3 includes coupled processing containers 5 including processing containers 31A and 31B, a gas supply source 39, an exhaust mechanism 40, and a gas supply device 42. Hereinafter, processing containers will be described, but since the processing containers 31A and 31B are configured similarly to each other, the processing container 31A will be representatively described with reference to the schematic view of FIG. 2. The processing container 31A includes a stage 32, a side wall heater 33, lifting pins 34, a lifting mechanism 35, and a shower head 41.

The side wall heater 33 is embedded in the side wall of the processing container 31A. The stage 32 is circular, and the position thereof in the horizontal direction is fixed within the processing container 31A. A stage heater 36 configured to heat and process a wafer W is embedded in the stage 32. Three lifting pins 34 (only two of which are illustrated in the figure) are provided to protrude and retract from the top surface of the stage 32 by the lifting mechanism 35. By the elevating operation of the lifting pins 34, the wafer W is delivered between the stage 32 and the above-mentioned transport mechanism 24 that has moved to a predetermined transport position in the processing container 31A. Pin the figure indicates the center of the stage 32, and as will be described in detail later, the wafer W is placed on the stage 32 such that the center of the wafer W is aligned with the center P.

The shower head 41 is provided on the ceiling of the processing container 31A, and, for example, a film forming gas is supplied to the shower head 41 from the gas supply source 39 common to the processing containers 31A and 31B via the gas supply device 42 including a valve or the like. One end of an exhaust pipe 38 is connected to the processing container 31A, and the other end of the exhaust pipe 38 is connected to the exhaust mechanism 40 common to the processing containers 31A and 31B. The exhaust mechanism 40 includes, for example, a vacuum pump.

During the operation of the substrate processing system 1, a vacuum atmosphere of a preset value is formed in the processing container 31A by the exhaust mechanism 40, and in order to process the placed wafer W at an arbitrary processing temperature, the stage 32 is heated to the processing temperature by the stage heater 36. In addition, in order to ensure reactivity of the film forming gas supplied into the processing container 31A, the side wall of the processing container 31A is heated to a temperature corresponding to the processing temperature by the side wall heater 33. In a state in which such a vacuum atmosphere is formed and heating is performed by each heater, the film forming gas is supplied from the shower head 41 to the wafer W placed on the stage 32 so as to form a TiN film.

Returning to FIG. 1, the controller 100 provided in the substrate processing system 1 will be described. The controller 100 is configured with a computer, and includes a program. In this program, a group of steps (commands) is set such that the operation of each part is controlled by outputting a control signal to each part of the substrate processing system 1, thereby performing the transport of the wafer W and the film forming process described above. Specifically, operations, such as the transport of the wafer W by the transport mechanisms 21 and 24, the opening and closing of each gate valve G, the switching of the atmosphere of the load lock chamber 12B, the supplying and stopping of the supply of the film forming gas by the gas supply apparatus 42 in the film forming module 3, and the raising and lowering of the lifting pins 34 by the lifting mechanism 35, are controlled by the above control signals. The above-mentioned program is stored in a storage medium such as a hard disk, a compact disc, a DVD, or a memory card, and is installed in a computer from the storage medium.

Figure 3:
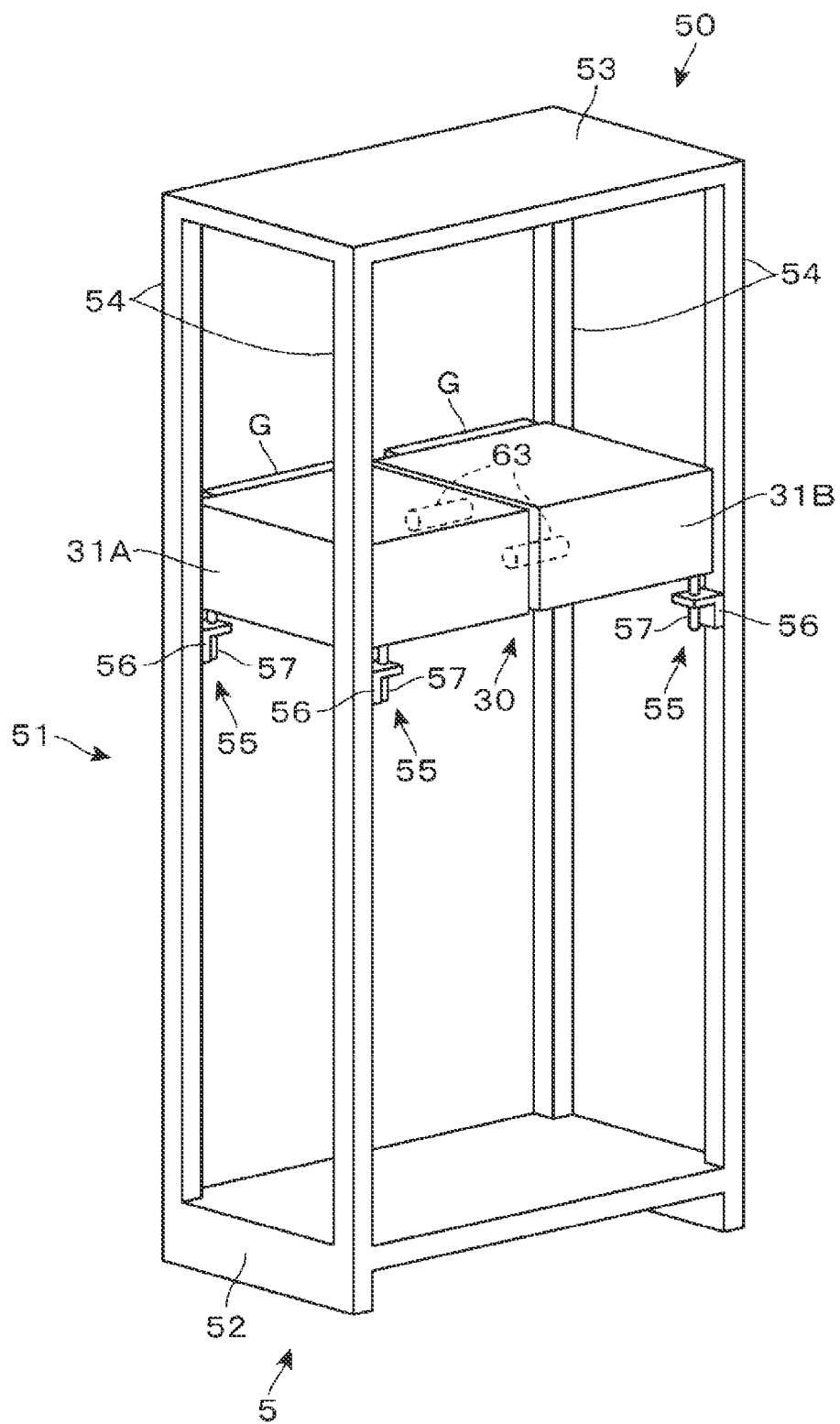
FIG. 3 is a rear perspective view of the coupled processing containers.
Figure 4:
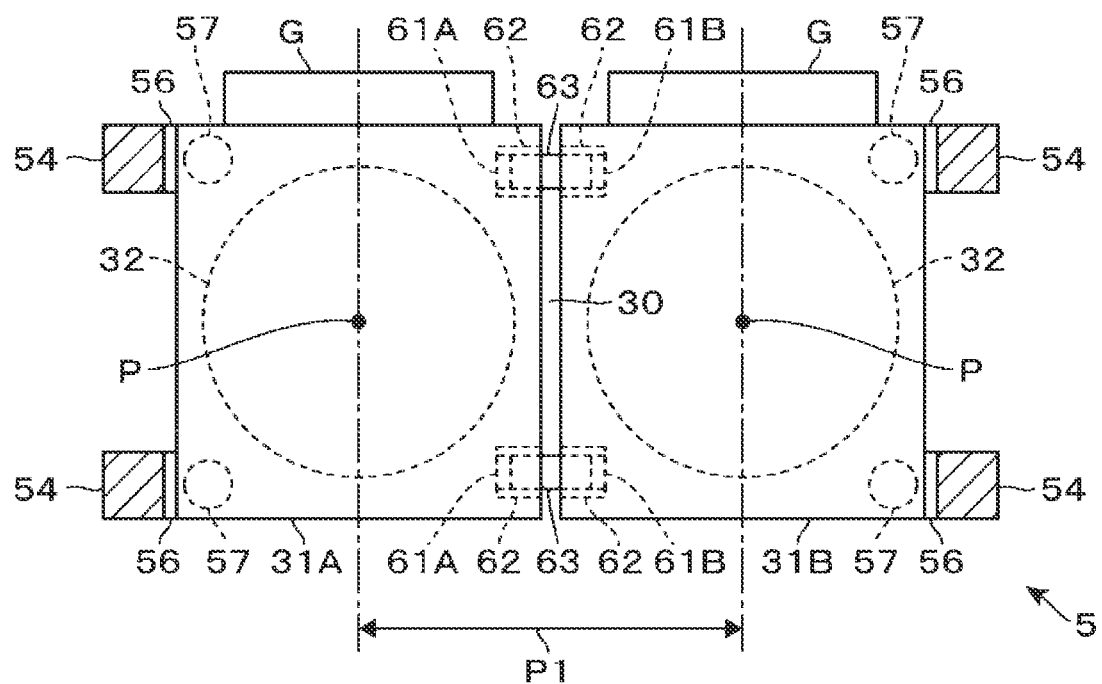
FIG. 4 is a top plan view of each of the processing containers constituting the coupled processing containers.
Figure 5:
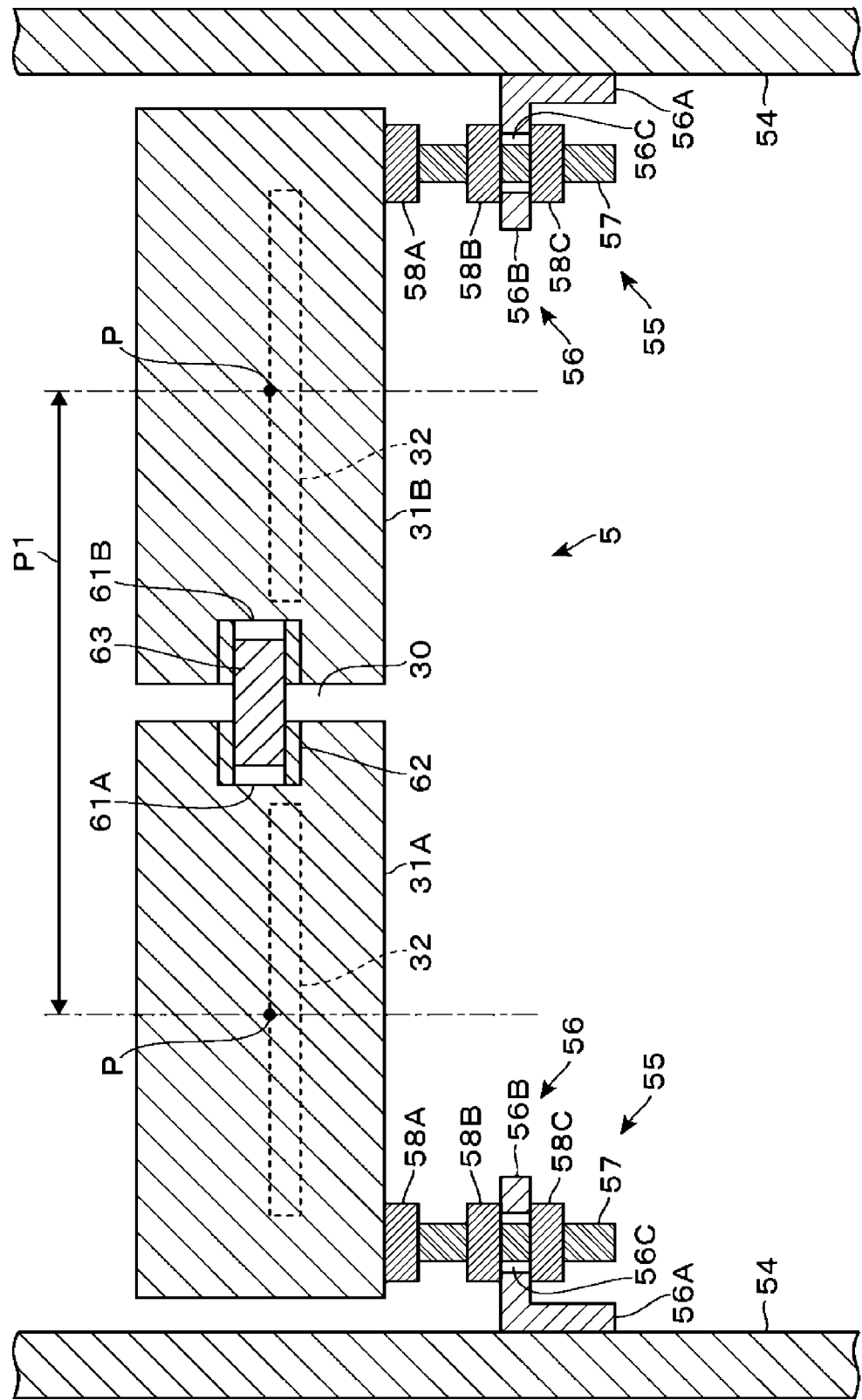
FIG. 5 is a schematic vertical cross-sectional view of the coupled processing containers.

Subsequently, the coupled processing containers 5 will be described. As described above, the coupled processing containers 5 include the processing containers 31A and 31B. In addition to the processing containers 31A and 31B, the coupled processing containers 5 include a support part 50 configured to support the processing containers 31A and 31B, and a shaft (shaft member) 63 configured to connect the processing containers 31A and 31B to each other. In the description of the coupled processing containers 5, a side on which a gate valve G is provided is referred to as the front side while referring to FIGS. 3 to 5. FIG. 3 is a rear perspective view of the coupled processing containers 5 when viewed toward the first vacuum transport module 13, FIG. 4 is a top plan view of the coupled processing containers 5, and FIG. 5 is a schematic vertical cross-sectional view of the coupled processing containers 5. The left side and the right side in the following description are the left side and the right side when viewed from the rear side toward the front side. The processing container 31A is located on the left side, and the processing container 31B is located on the right side. P1 in FIG. 4, etc. indicates the distance between the centers P of the stages 32 in respective processing containers 31 (the pitch between the stages 32).

The processing containers 31A and 31B, which are the constituent elements of the coupled processing containers 5, will be described in more detail. The processing containers 31A and 31B are formed in a square shape, and the side walls thereof are separated from each other without being shared. The processing container 31A which is the first processing container and the processing container 31B which is the second processing container are located at the same height as each other, and the side wall of the processing container 31A and the side wall of the processing container 31B face each other with a gap 30 interposed therebetween. The front side of each of the processing containers 31A and 31B is fixed to the vacuum transport module 13 or 14 via a gate valve G.

The support part 50 is provided on a floor on which the substrate processing system 1 is installed, and supports the processing containers 31A and 31B above the floor. The support part 50 includes a frame 51 and a support part body 55. The frame 51 includes a bottom portion 52, a horizontal upper plate 53, and four vertical columns 54 connecting the bottom portion 52 and the upper plate 53, the bottom portion 52 is provided directly above the floor, and the upper plate 53 is provided above the processing containers 31A and 31B. Two of the four columns 54 are provided on the left side of the processing container 31A to be spaced apart from each other in the front-rear direction, and the other two columns are provided on the right side of the processing container 31B to be spaced apart from each other in the front-rear direction. Therefore, assuming that the processing containers 31A and 31B constitute a unit of processing containers, the columns 54 are provided so as to surround the unit. The support columns 54 are spaced apart from the side walls of the processing containers 31A and 31B, respectively.

The support part body 55 includes brackets 56, long screws 57, and nuts 58A to 58C, connects the support columns 54 with the bottom portions of the processing containers 31A and 31B, and supports the processing containers 31A and 31B with respect to the support columns 54.

The bracket 56 is provided on each support column 54 and has an L shape in a front view, including a vertical portion 56A and a horizontal portion 56B. The vertical portion 56A is provided so as to extend along the support column 54 at a position upwardly spaced apart from the bottom portion 52 of the frame 51, and is fixed to the side surface of the support column 54 facing the center between the left and right of the frame 51. The horizontal portion 56B has a hollow portion extending horizontally from the upper side of the vertical portion 56A toward the center between the left and right of the frame 51. More specifically, the horizontal portion 56B of the bracket 56 provided on each of the left support columns 54 (the columns near the first processing container) extends below the left end portion of the processing container 31A, and the horizontal portion 56B of the bracket 56 provided on each of the right support columns 54 (the columns near the second processing container) extends below the right end portion of the processing container 31B. A through hole 56C is vertically perforated in each horizontal portion 56B.

Long screws 57 are provided to extend vertically downward from the front side and the rear side of the bottom surface of the left end portion of the processing container 31A, respectively. Long screws 57 are provided to extend vertically downward from the front side and the rear side of the bottom surface of the right end portion of the processing container 31B, respectively. Nuts 58A, 58B, and 58C are sequentially provided on each of these long screws 57 from the upper side to the lower side. Each long screw 57 is inserted through a through hole 56C in the bracket 56. The horizontal portion 56B of each bracket 56 is sandwiched between the nuts 58B and 58C from above and below, and the bottom surface of the processing container 31 is placed on the nut 58A. Therefore, the nut 58B is supported by the opening edge of the through hole 56C, whereby the processing container 31 is supported on the nut 58A. More specifically, according to this configuration, the support part bodies 55 are not provided on the side where the gap 30 is provided, and each of the left end portion of the left processing container 31A and the right end portion of the right processing container 31B is only supported by the frame 51. That is, only the sides of the processing containers 31A and 31B opposite the sides where the gap 30 is provided are supported.

By being supported in this way, the bottom portions of the processing containers 31A and 31B are floating in the air, except for the portions that are in contact with the nuts 58A. That is, a large space is formed between the bottom portions of the processing containers 31A and 31B and the bottom portion 52 of the frame 51. In this space, for example, equipment (a gas box) configured to distribute, to the processing containers 31A and 31B, a film forming gas supplied from the gas supply source 39 and including the gas supply device 42 described with reference to FIG. 2, electrical equipment configured to operate each film forming module 3, and the like are stored. The bottom portions of the processing containers 31A and 31B are floating such that no load is applied to the gas box and the electrical equipment.

The hole diameter of the through holes 56C in the brackets 56 is larger than the shaft diameter of the long screws 57 forming first vertical shafts. Therefore, a gap is formed between the outer peripheral surface of each long screw 57 and the inner peripheral surface of each through hole 56C. The reason why the gap is formed in this way will be described later. In the support part bodies 55 described above, long screws 57 and nuts 58A to 58C are configured as support connection parts connected to the processing containers 31A and 31B, and the brackets 56 correspond to base parts that support the support connection parts. The nuts 58B, which are in contact with respective brackets 56, correspond to first flanges provided on the first vertical shafts, respectively.

In the side wall of the processing container 31A and the side wall of the processing container 31B facing the gap 30, recesses 61A and 61B are formed, respectively, and the recesses 61A and 61B are provided on the front side and the rear side of the side walls, respectively. The recess 61A and the recess 61B face each other. The peripheral wall of each of the recess 61A and the recess 61B is configured as a bush 62 which is a bearing. The bush 62 may be, for example, a substrate obtained by subjecting carbon steel to nitriding treatment and having a relatively low coefficient of friction with respect to a shaft 63 described later or, for example, a cast iron-based solid-lubricant embedded bearing. As a specific example, a known self-lubricating bearing, such as the trade name: #500F-SL1 available from OILES CORPORATION, may be used as the bush 62.

Two shafts 63 extending from the side wall of the processing container 31A to the side wall of the processing container 31B are provided in the gap 30, and one end portion of each shaft 63 is inserted into the recess 61A and the other end is inserted into the recess 61B, in which the recess 61A and the recess 61B face each other. Therefore, the shafts 63 connect the processing container 31A and the processing container 31B across the gap 30. The shafts 63, which are connecting parts, are slidable in the left-right direction, which is the axial direction of the shafts 63, with respect to the recesses 61A and 61B, which are first recesses constituting the side walls of the processing containers 31A and 31B, respectively. When the bushes 62 are configured as described above, it is possible to perform smooth sliding, and to eliminate the need for oil feeding or to reduce the frequency of oil feeding.

The reason for providing the gap 30, the recesses 61A, 61B, and the shaft 63 between the side walls of the processing containers 31A and 31B as described above will be described. It is assumed that the side walls of the processing containers 31A and 31B are connected to each other without providing the gap 30 between the processing containers 31A and 31B, in other words, the side walls are shared between the processing containers as described in Patent Document 1. When processing wafers W as described above, the processing containers 31A and 31B are heated by the side wall heater 33, and the temperature of the side walls of the processing containers 31A and 31B heated by the side wall heater 33 corresponds to the processing temperature of the wafers W. However, the processing temperature of the wafers W may be changed, and in that case, the temperature of the side walls of the processing containers 31A and 31B is also changed according to the change of the processing temperature. As an example, the temperature of the side walls is changed in the range of 50 degrees C. to 170 degrees C. Then, the side walls thermally expand depending on the temperature thereof.

Assuming that the side walls of the processing containers 31A and 31B are coupled to each other as described above, the pitch P1 between the stages 32 fluctuates depending the amount of thermal expansion of the coupled side walls. That is, as the temperature of the walls of the processing containers 31A and 31B becomes higher, the processing containers expand greatly. Thus, the stages 32 fixed to the processing containers 31A and 31B move away from each other, and thus the pitch P1 becomes larger. Further, since the side walls of the processing containers 31A and 31B are coupled to each other, these side walls are pressed against each other by thermal expansion. As a result, the center between the left and right of the processing container 31A is deviated to the left side and the center between the left and right of the processing container 31B is deviated to the right side, and thus the pitch P1 increases.

Meanwhile, the vacuum transport modules 13 and 14 are maintained at room temperature, and the distance between the two holding parts 26 of the transport mechanism 24 is constant. That is, two wafers W are transported to the processing containers 31A and 31B at a regular interval on the left and right regardless of the temperature of the side walls of the processing containers 31A and 31B. Therefore, due to the temperature change of the side walls of the processing containers 31A and 31B, the wafers W are transported to the stages 32 in a state in which the centers P of the wafers W and the centers P of the stages 32 are deviated in the left-right direction. In addition, the front sides of the processing containers 31A and 31B are fixed to the vacuum transport module 13 via the gate valves G. Thus, when the side walls of the processing containers 31A and 31B are coupled to each other, large stress is applied to the processing containers 31A and 31B when the amount of thermal expansion thereof is large. As a result, the processing containers 31A and 31B may be distorted. Patent Document 1 described above does not describe the problem of thermal expansion of the processing containers, and cannot solve the problem.

Therefore, in the coupled processing containers 5, as described above, the side walls of the processing containers 31A and 31B are separated from each other, and the gap 30 is provided therebetween. As a result, even if the amount of thermal expansion of the processing containers 31A and 31B fluctuates, the position in the left-right direction of each of the side walls of the processing containers 31A and 31B facing each other can be changed. That is, even if the amount of thermal expansion of the processing containers 31A and 31B is large, the side walls do not interfere with each other because the position of each of the side walls changes in the gap 30. Therefore, the fluctuation of the pitch P1 due to thermal expansion is suppressed. However, as described above, only the left end portion of the processing container 31A and only the right end portion of the processing container 31B are supported by the support part 50 such that a space is formed below the processing containers 31A and 31B. Therefore, it is conceivable that the processing containers 31A and 31B are tilted such that the right side of the processing container 31A and the left side of the processing container 31B hang down by providing the gap 30.

Therefore, the shaft 63 and the recesses 61A and 61B are provided together with the gap 30. Since the shafts 63 are slidable in the recesses 61A and 61B, the positions of the side walls of the processing containers 31A and 31B can be changed by the thermal expansion described above so that the fluctuation of the pitch P1 is suppressed. Since the processing containers 31A and 31B are connected to each other by the shafts 63 while the fluctuation of the pitch P1 is suppressed in this way, the above-mentioned tilting is prevented and the processing containers 31A and 31B are stably supported. As described above, the shafts 63 have a role of supporting the processing containers 31A and 31B together with the support part 50 described above. The shafts 63 also serve as a guide for determining the positions of the processing containers 31A and 31B.

Further, as described above, a gap is formed between the through hole 56C of the bracket 56 that constitutes each of the support part body 55 and the long screw 57 connected to the processing container 31A. By providing the gap, the bottom surface of the nut 58B provided on the long screw 57 is slidable on the opening edge of the through hole 56C when the processing containers 31A and 31B thermally expand or contract. That is, the position in the left-right direction of each of the left end portion of the processing container 31A and the right end portion of the processing container 31B is capable of being changed with respect to the frame 51 of the support part 50. Assuming that the positions in the left-right direction of the left end portion of the processing container 31A and the right end portion of the processing container 31B are fixed to the frame 51, the processing container 31A expands to the right side from the left end portion thereof, which is fixed as described above, as a base point, and the processing container 31B expands to the left side from the right end portion thereof, which is fixed as described above, as a base point. Then, the pitch P1 is reduced. However, in the present configuration, since the positions in the left-right direction of the left end portion of the processing container 31A and the right end portion of the processing container 31B are not fixed to the frame 51 as described above, such reduction of the pitch P1 is prevented.

In this way, the position in the left-right direction of each of the right side of the processing container 31A and the left side of the processing container 31B is capable of being changed by the gap 30, the recesses 61A and 61B, and the shafts 63, and the position in the left-right direction of each of the left side of the processing container 31A and the right side of the processing container 31B is capable of being changed by the support part bodies 55. Therefore, the pitch P1 is maintained constant without fluctuating. In addition, the width in the left-right direction of the gap 30 is, for example, 2 mm to 6 mm, more specifically 4 mm when the processing containers 31A and 31B are at room temperature (20 degrees C. to 25 degrees C.).

As described above, since the front sides of the processing containers 31A and 31B are fixed to the vacuum transport modules 13 and 14 via gate valves G, the center P of each stage 32 is shifted in the front-rear direction by the above-mentioned thermal expansion or contraction. Specifically, the larger the amount of thermal expansion, the more the centers P move to the opposite side (rear side) with respect to the gate valve G. In addition, the long screws 57 are configured to be movable not only in the left-right direction but also in the front-rear direction through the gaps between the long screws 57 and the through holes 56C so that the centers P are capable of being shifted back and forth.

Although the centers P of the stages 32 move back and forth in this way, the transport positions of the transport mechanism 24 (the positions of the stages 32 when the lift pins 34 move up and down) are capable of being adjusted back and forth. Therefore, by properly setting the transport positions, it is possible to align the positions in the front-rear direction of the centers of wafers W transported to the stages 32 and the centers P of the stages 32. In order to align the positions in the front-rear direction in this way, before processing wafers W with a desired processing recipe, transport positions for the processing that is performed with that processing recipe is determined by performing a correction procedure to the transport mechanism 24. For example, data on a corresponding relationship between transport positions by the transport mechanism 24 and the output of the side wall heater 33 may be stored in the memory constituting the controller 100 so that the transport positions may be determined based on the data when the processing recipe is changed such that the output of the side wall heater 33 is changed as well.

Figure 6:
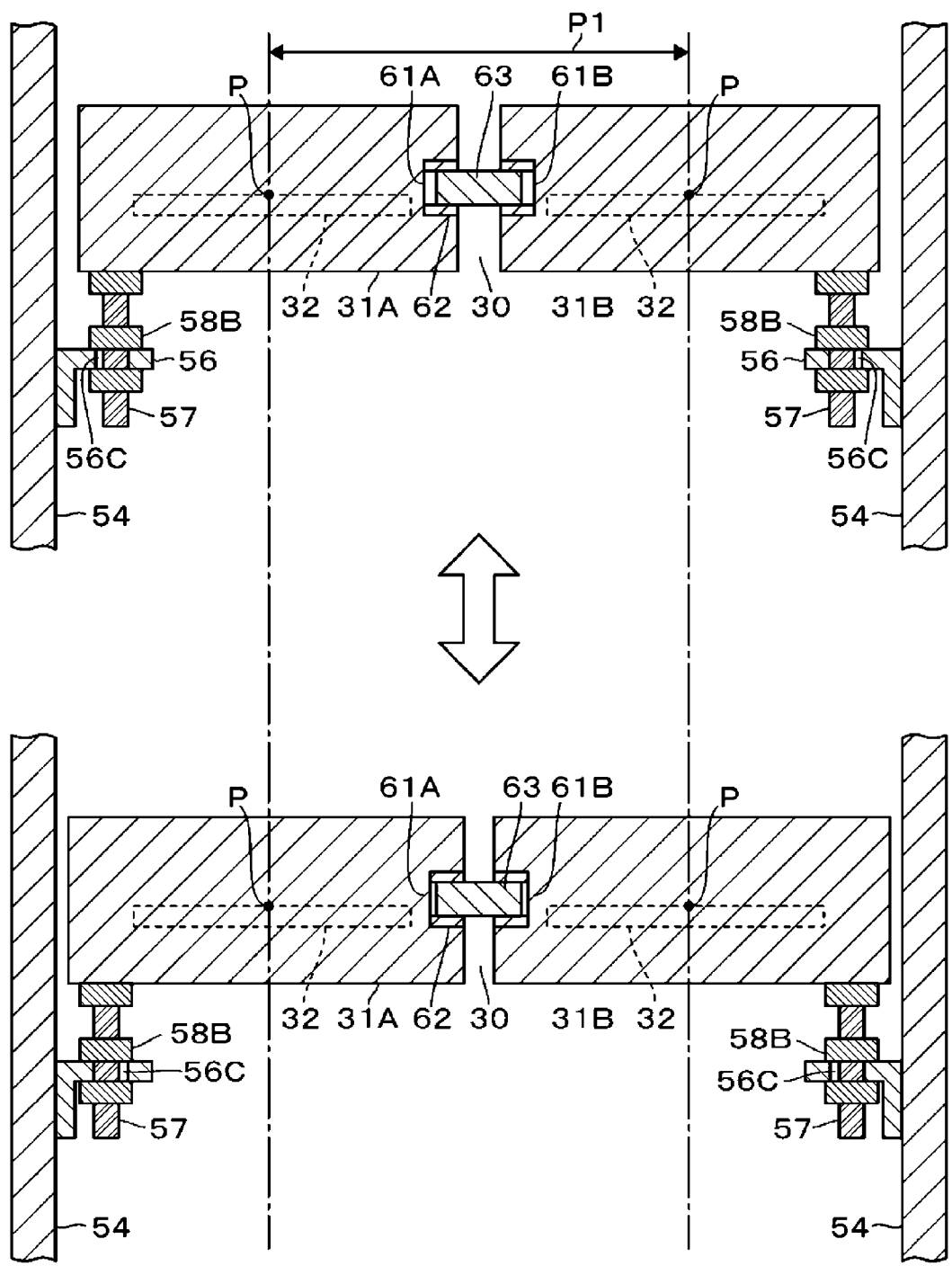
FIG. 6 is an explanatory view showing, in a vertical cross-sectional view, how the distance between the processing containers changes.
Figure 7:
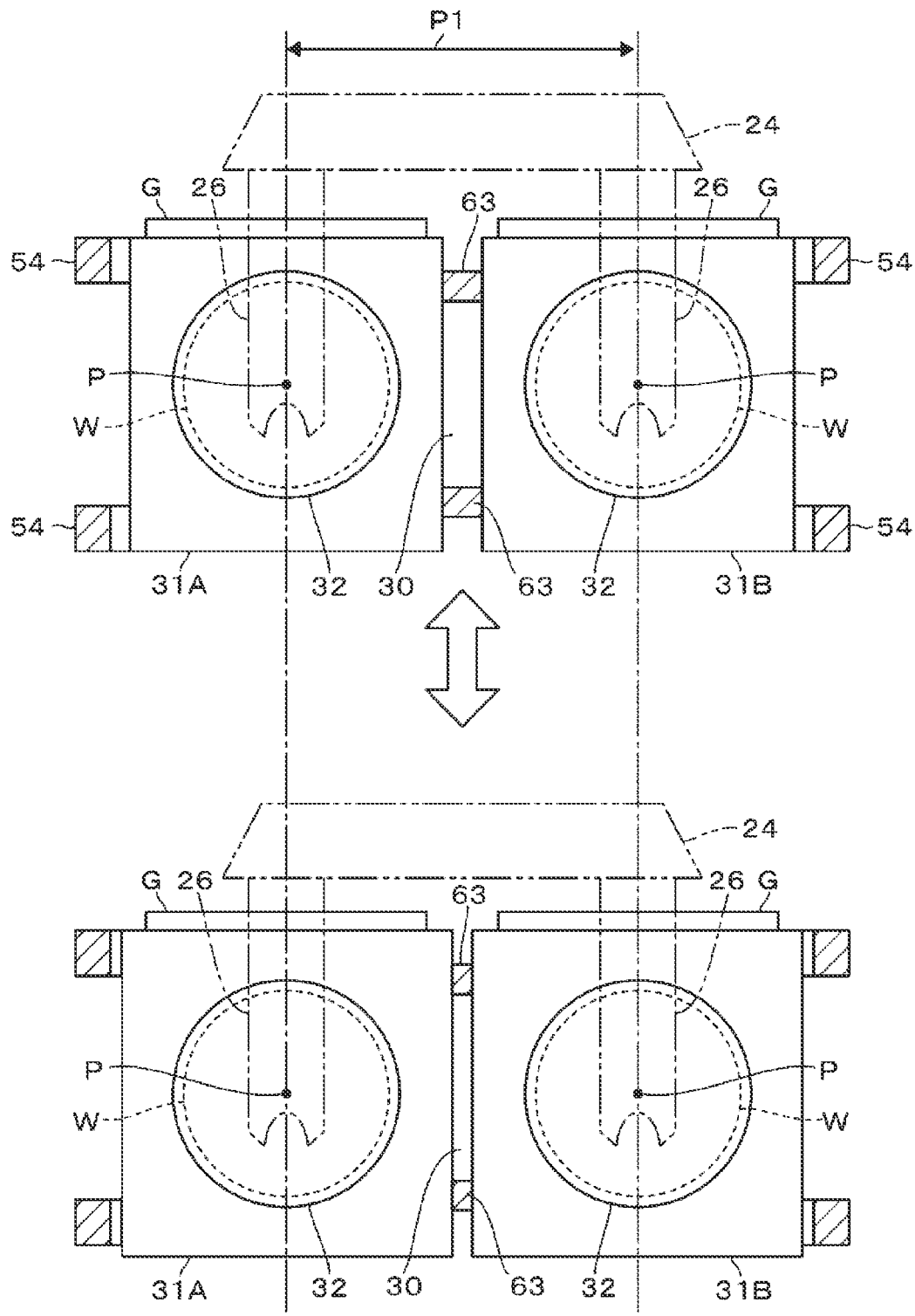
FIG. 7 is an explanatory view showing, in a plan view, how the distance between the processing containers changes.

With reference to the vertical cross-sectional side view of FIG. 6 and the plan view of FIG. 7, a state when the output of the side wall heater 33 changes and the amount of thermal expansion of the processing containers 31A and 31B changes will be described. Upper sides of FIGS. 6 and 7 illustrate a state in which the temperature of the processing containers 31A and 31B is low, while lower sides thereof show a state in which the temperature of the processing containers 31A and 31B is high. Hereinafter, description will be made on a change from a state in which the temperature of the processing containers 31A and 31B rises and the amount of thermal expansion of each of the processing containers 31A and 31B increases, that is, a state shown in the upper side of each figure, to a state illustrated on the lower side.

The processing containers 31A and 31B thermally expand from the front sides thereof connected to the gate valves G as a base point. That is, the processing containers 31A and 31B thermally expand so that the positions of the front ends thereof connected to the gate valves G do not change. Due to the thermal expansion, the recesses 61A and 61B in the processing containers 31A and 31B slide with respect to the shafts 63 so as to be close to each other, and thus the side wall of the processing container 31A and the side wall of the processing container 31B facing the gap 30 are close to each other. While the shafts 63 and the recesses 61A and 61B slide in this way, the nuts 58B of the long screws 57 connected to the processing container 31A slide with respect to the brackets 56 and move to the left rear side, and the nuts 58B of the long screws 57 connected to processing container 31B slide with respect to the bracket 56 and move to the right rear side. As each part slides in this way, the pitch P1 of the stages 32 does not change compared with that before the amount of thermal expansion increases, as described above. Since the center P of each stage 32 moves to the rear side compared with that before the change in the amount of thermal expansion, the transport mechanism 24 is set such that the amount of entry from the gate valve G into each of the processing containers 31A and 31B is set to be large, and then wafers W are transported in the substrate processing system 1.

Briefly explaining the case where the amount of thermal expansion of the processing containers 31A and 31B is small (the processing containers 31A and 31B thermally contract), respective parts, such as the recesses 61A and 61B and the nuts 58B, move in the direction opposite to that in the case where the amount of thermal expansion is large, and the pitch P1 of the stages 32 does not change. Since the center P of each stage 32 moves to the front side compared with that before the change in the amount of thermal expansion, the transport mechanism 24 is set such that the amount of entry from the gate valve G into each of the processing containers 31A and 31B is set to be small, and then wafers W are transported in the substrate processing system 1.

As described above, according to the coupled processing containers 5, the pitch P1 of the stages 32 does not change, and this pitch P1 is aligned with the distance between the centers of wafers W held by the two holding parts 26 of the transport mechanism 24. Therefore, it is possible to perform a film forming process in a state in which wafers W are placed on the stages 32 such that the centers P of the stages 32 are aligned with the centers P of the wafers W. Thus, it is possible to prevent the occurrence of problems related to the film quality or thickness of a TiN film due to misalignment of the wafers W and the stages 32.

In addition, in the coupled processing containers 5, the right side of the processing container 31A and the left side of the processing container 31B are not supported, and only the left side of the processing container 31A and the right side of the processing container 31B are supported by the support part body 55 from below. Accordingly, as described above, it is possible to form a large space below the processing container 31A and the processing container 31B, and to install each equipment constituting the film forming module 3 in the space. This makes it possible to prevent the film forming module 3 and hence the substrate processing system 1 from becoming large in size.

Then, in the substrate processing system 1, two wafers W are processed collectively, and the wafers W are placed such that the centers of the wafers W are aligned with the centers P of respective stages 32, and are processed in the processing containers 31A and 31B, which are separated from each other. Accordingly, a process may be performed by applying a processing recipe (processing conditions such as a pressure in the processing container 31, a gas flow rate, and a temperature of each heater) used in a single-wafer type film forming apparatus that performs a film forming process on wafers W one by one. Therefore, it is advantageous because it is possible to reduce the labor for newly creating or changing a processing recipe for the substrate processing system 1.

Second Embodiment

Figure 8:
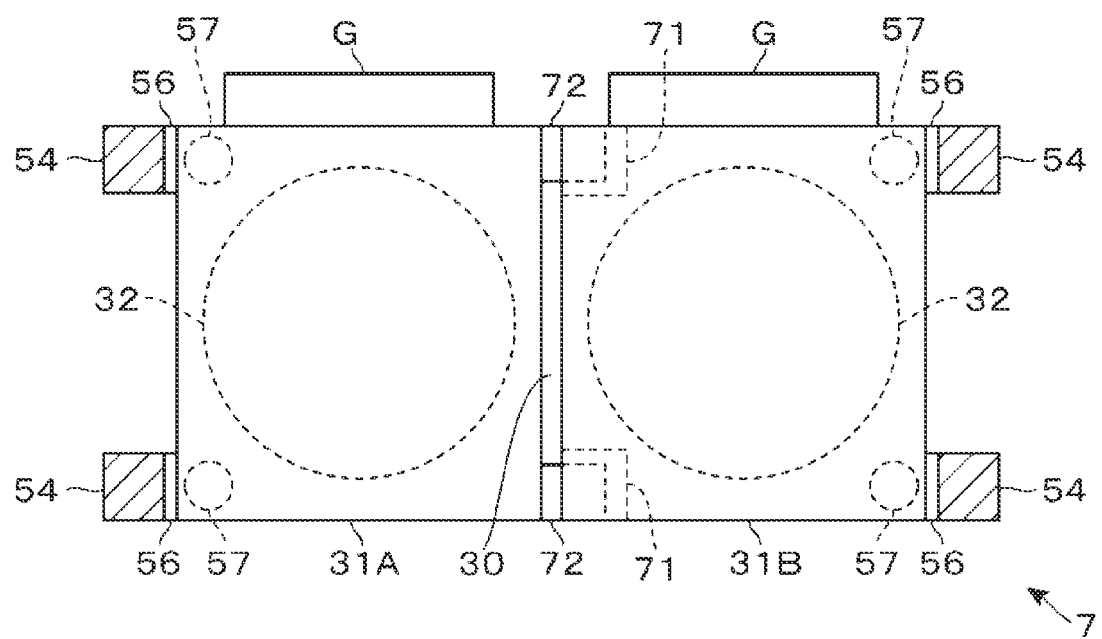
FIG. 8 is a plan view of coupled processing containers according to a second embodiment of the present disclosure.
Figure 9:
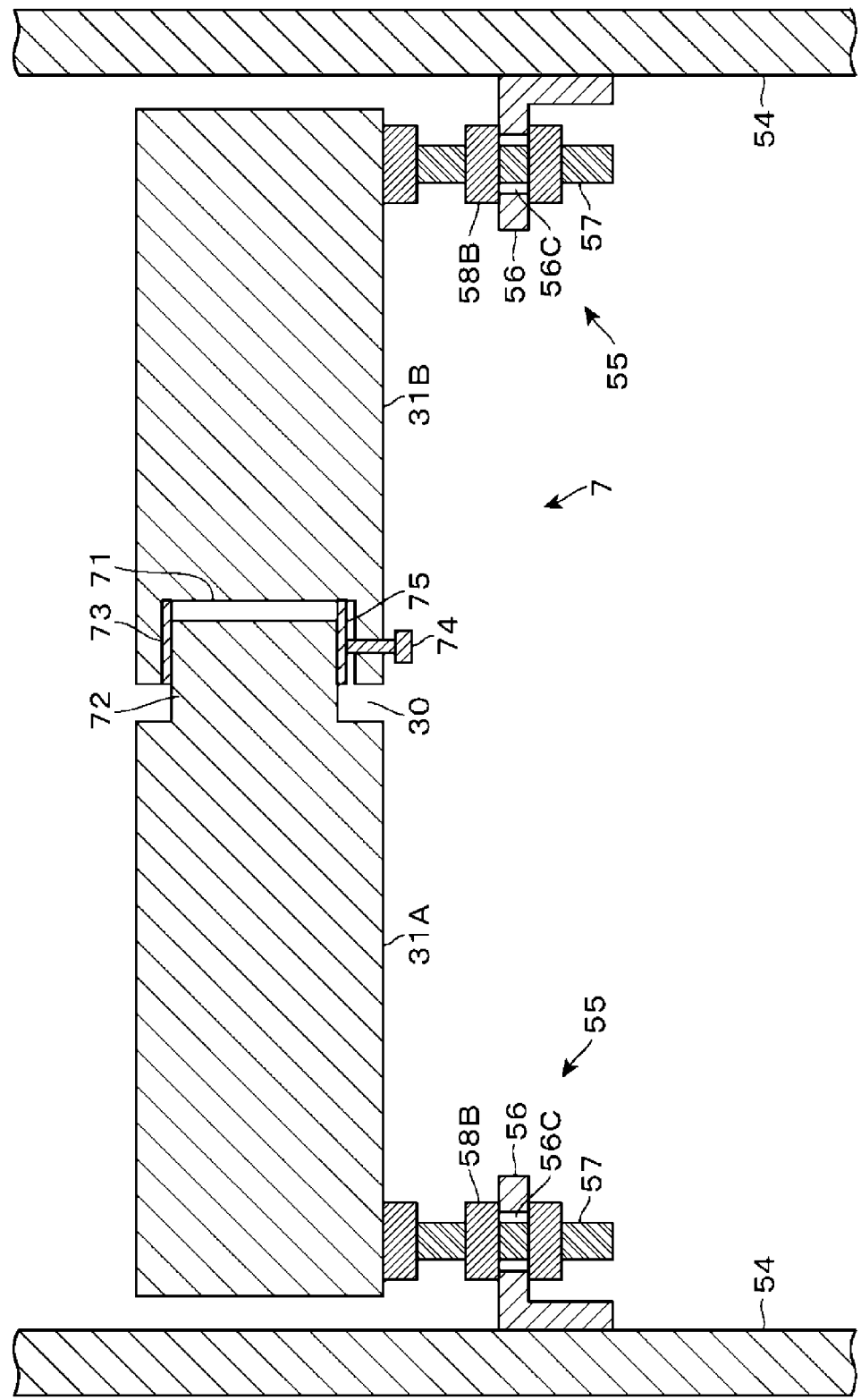
FIG. 9 is a side view of the coupled processing containers.

Coupled processing containers 7, which are a second embodiment of the coupled processing containers, will be described with reference to a plan view of FIG. 8 and a vertical cross-sectional side view of FIG. 9, focusing on differences from the coupled processing containers 5. In this second embodiment, the recesses 61A and 61B and the shafts 63 described above are not provided. Instead, in the processing container 31B, two square recesses 71 are formed by cutting out the front end portion and the rear end portion of the side wall facing the gap 30. The front end portion and the rear end portion of the side wall of the processing container 31A facing the gap 30 form square protrusions (convex portions) 72 protruding to the right side, and the protrusions 72 are inserted into the recesses 71, which are second recesses. Therefore, the protrusions 72 are configured as connecting portions that connect the processing containers 31A and 31B.

A plate 73 is fixedly provided on the upper wall surface so as to cover the upper wall surface of the recesses 71. Therefore, the top surfaces of the recesses 71 are formed by the plate 73. In addition, the processing container 31B is provided with vertical through holes that connect the bottom surface of the processing container 31B and the insides of the recesses 71. Into the through holes, screws 74 are inserted respectively from the lower sides thereof. The screws 74 are screwed with threads provided on the peripheral surfaces of the through holes, respectively, and the tips thereof protrude into the recesses 71, respectively. Then, in each recess 71, a plate 75, which is a lower contact part, is horizontally provided on the tip of a screw 74. Therefore, it is possible to change the height of the plate 75 in the recess 71 using the screw 74, and a protrusion 72 is sandwiched between the plates 73 and 75 from above and below and tightened.

As the plates 73 and 75, it is possible to use members having the same structure as the bushes 62 in the first embodiment, except that the plates 73 and 75 are formed as plate-like bodies rather than cylindrical bodies. Therefore, it is possible to use a carbon steel material subjected to nitriding treatment as described above and a cast iron-based metal member in which a solid lubricant is embedded. The metal member into which solid lubricant is embedded is not limited to a cast iron-based material, and may be, for example, copper or brass. Similarly, even in the first embodiment, the metal material into which solid lubricant is embedded is not limited to a cast iron-based material.

Figure 10:
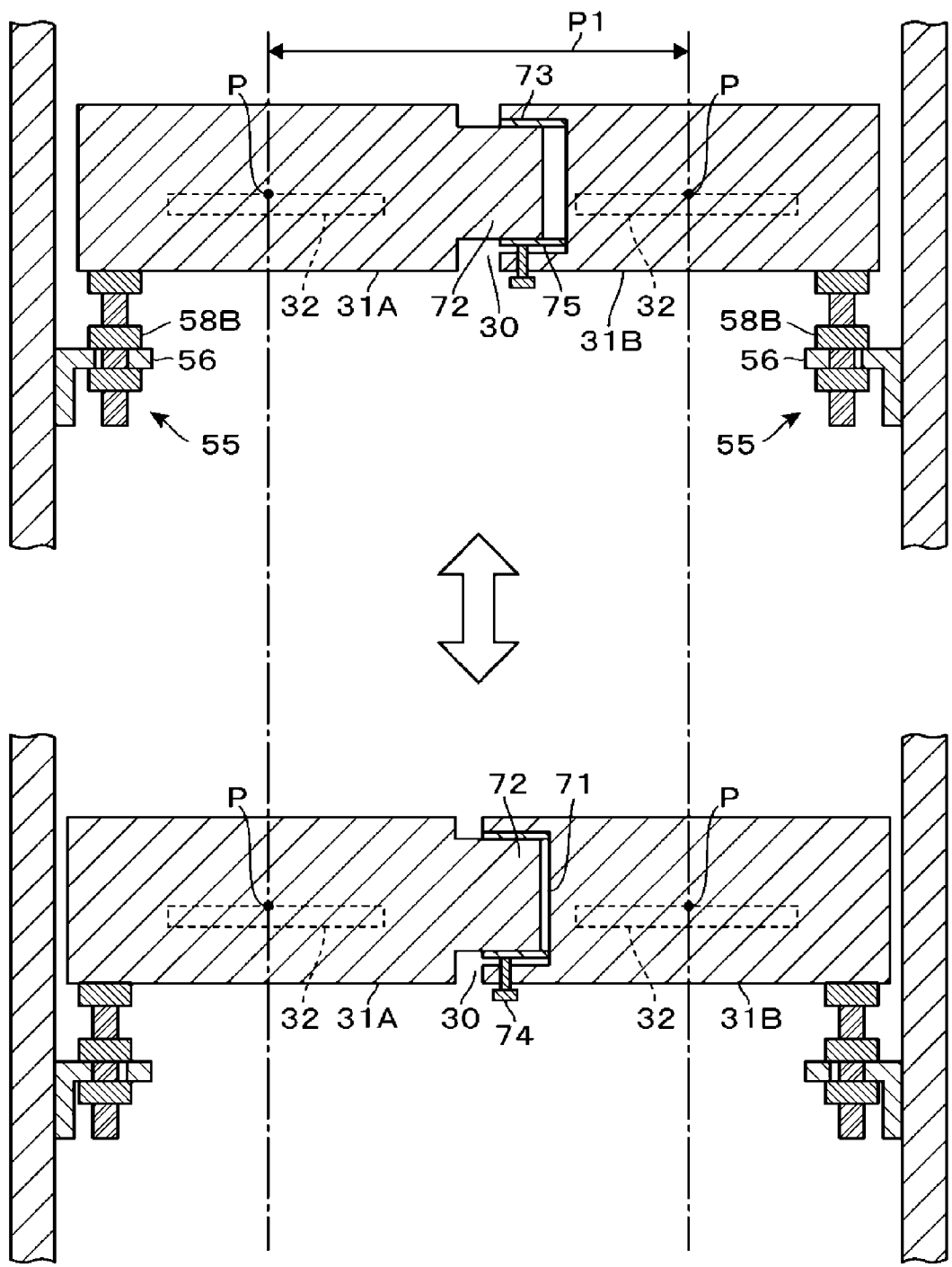
FIG. 10 is a vertical cross-sectional side view of the coupled processing containers showing how the distance between the processing containers changes.

FIG. 10 illustrates a state when the output of the side wall heater 33 changes and the amount of thermal expansion of the processing containers 31A and 31B changes as in FIG. 6, and in which the upper side of the figure illustrates a state in which the temperature of the processing containers 31A and 31B is low, and the lower side illustrates a state in which the temperature of the processing containers 31A and 31B is high. As illustrated in FIG. 10, by changing the amount of thermal expansion of the processing containers 31A and 31B, the distance between the side wall of the processing container 31A and the side wall of the processing container 31B facing each other with the gap 30 interposed therebetween changes while the side walls do not interfere with each other, as in the first embodiment.

In addition, when the amount of thermal expansion of the processing containers 31A and 31B changes in this way, the protrusions 72 and the plates 73 and 75 provided on the side wall of the processing container 31B slide in the left-right direction. On the other hand, the nuts 58B and the brackets 56 also slide in the support part bodies 55 as in the first embodiment. Since the sliding occurs in each part due to the change in the amount of thermal expansion of the processing containers 31A and 31B, the pitch P1 of the stages 32 is maintained constant as in the first embodiment. Since the processing containers 31A and 31B are connected to each other via the protrusions 72 and the recesses 71, the tilting of the processing containers 31A and 31B is also suppressed, as in the first embodiment. As described above, with the coupled processing containers 7 of the second embodiment, the same effect as that of the coupled processing containers 5 described above is obtained. In addition, in the coupled processing containers 7, because it is possible to adjust the height positions from the plates 75 in the respective recesses 71, it is possible to reliably bring the plates 73 and 75 into close contact with the protrusions 72. Therefore, the tilting of the processing containers 31A and 31B is more reliably prevented.

Third Embodiment

Figure 11:
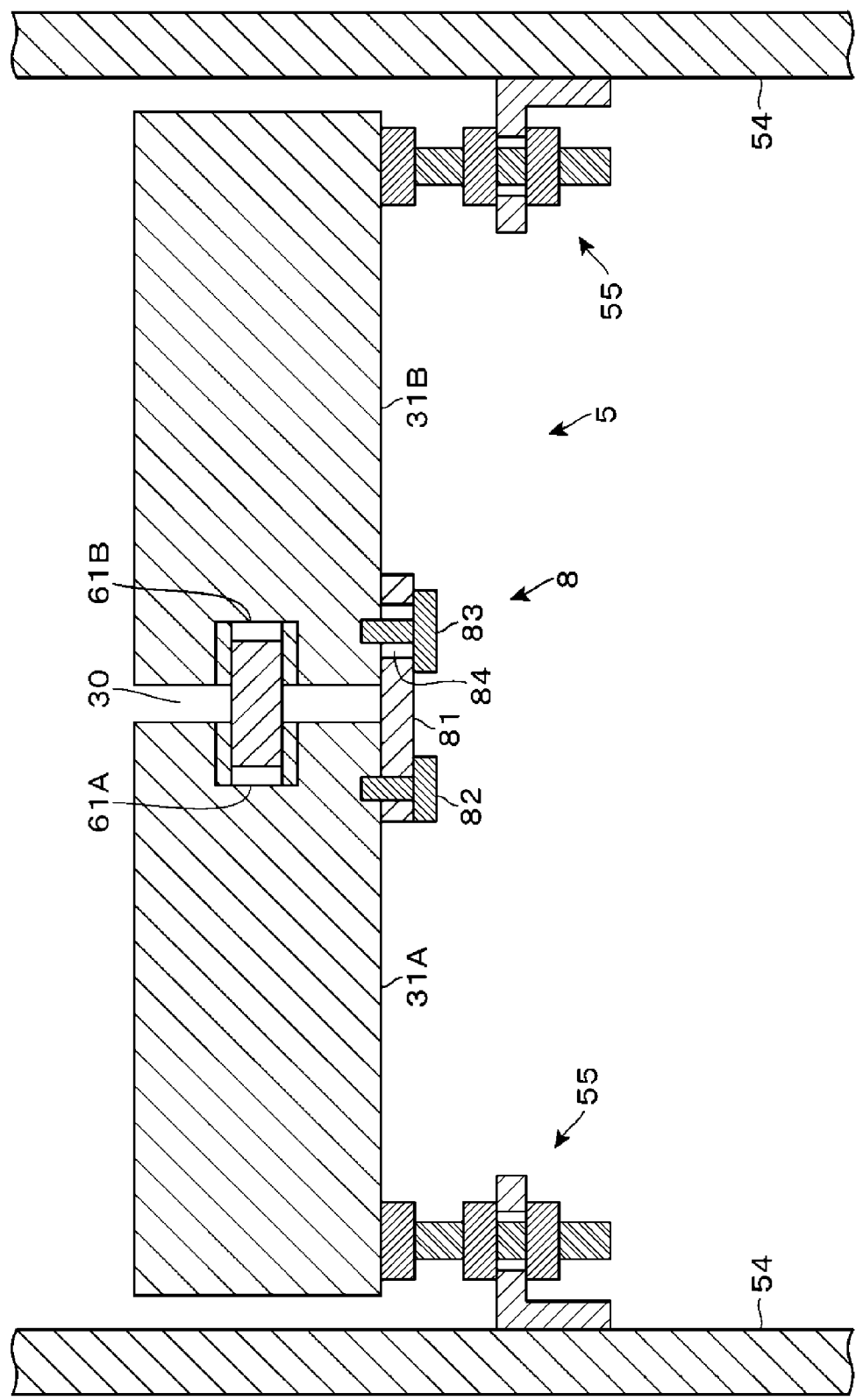
FIG. 11 is a vertical cross-sectional side view of coupled processing containers according to a third embodiment of the present disclosure.

A third embodiment illustrated in FIG. 11 has a configuration in which a bottom surface sliding part 8 is further added to the coupled processing containers 5 of the first embodiment. The bottom surface sliding part 8 includes a plate 81 and screws 82 and 83. The plate 81 is provided to extend from the right end portion of the bottom surface of the processing container 31A toward the left end portion of the bottom surface of the processing container 31B. The top surface of one end portion of the plate 81 is fixed to the bottom surface of the processing container 31A by the screw 82.

A through hole 84 is vertically provided at the other end portion of the plate 81 and opens toward the bottom surface of the processing container 31B, and the screw 83 is inserted into the through hole 84 from below. The tip of the screw 83 is fixed to the bottom surface of the processing container 31B, and the hole edge portion of the through hole 84 in the plate 81 is sandwiched between the head of the screw 83 and the bottom surface of the processing container 31B. Therefore, the plate 81 is configured as a connecting part body that connects the bottom surface of the processing container 31A and the bottom surface of the processing container 31B across the gap 30. The diameter of the screw 83 is smaller than the diameter of the through hole 84, and a gap is formed between the side peripheral surface of the screw 83 and the plate 81. Therefore, when the amount of thermal expansion of the processing containers 31A and 31B changes, the other end portion of the plate 81 is slidable back and forth and left and right with respect to the bottom surface of the processing container 31B and the head of the screw 83. Regarding the screw 83, the head corresponds to the second flange, and the portion other than the head corresponds to the second vertical shaft.

Figure 12:
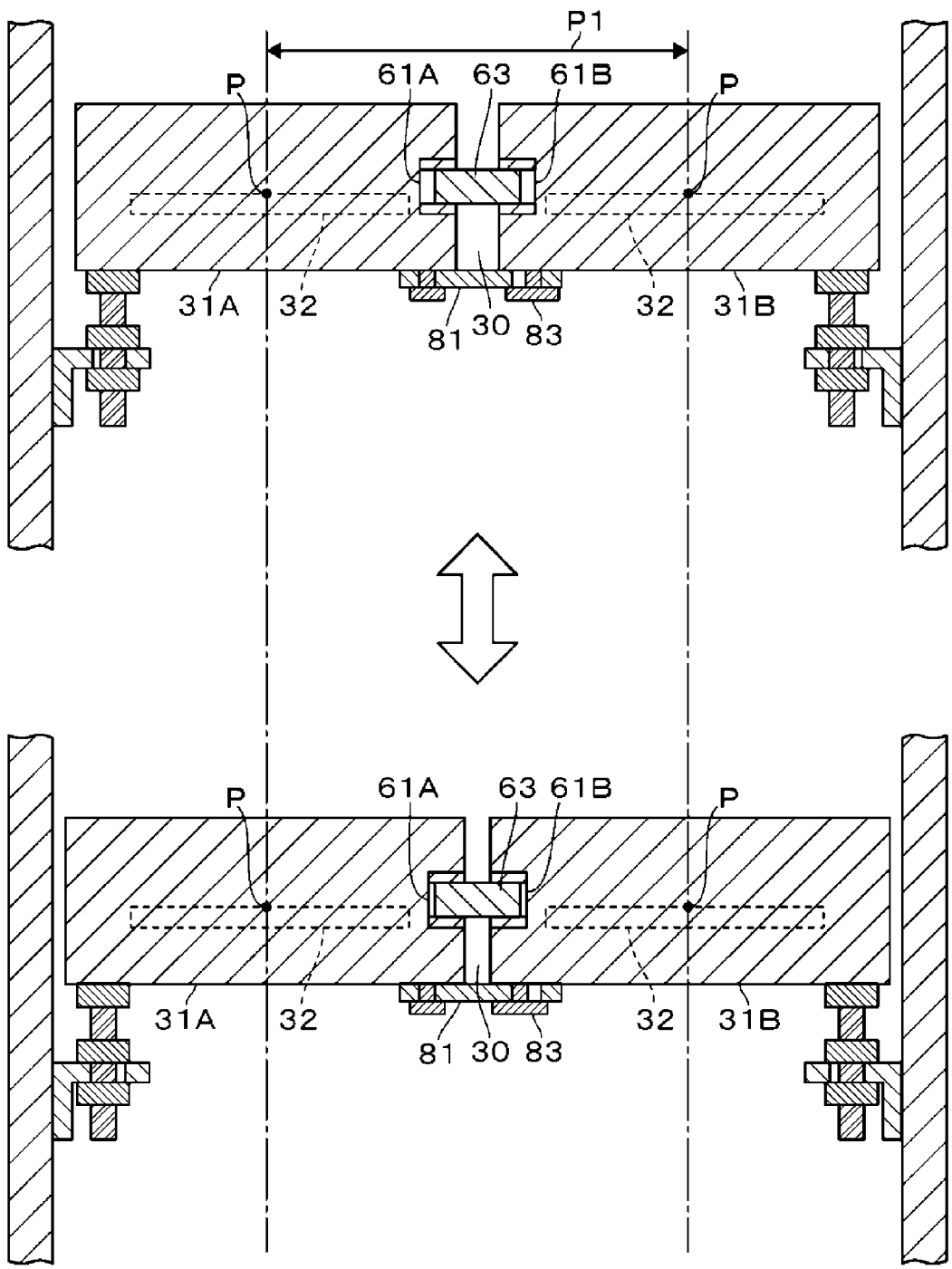
FIG. 12 is a vertical cross-sectional side view of the coupled processing containers showing how the distance between the processing containers changes.

Similar to the shafts 63 described in the first embodiment, the bottom surface sliding part 8 having the above-described configuration connects the processing containers 31A and 31B such that the positions of the side walls of the processing containers 31A and 31B facing each other can be changed. FIG. 12 shows changes of the amount of thermal expansion of the processing containers 31A and 31B as in FIG. 6, and shows how the pitch P1 of the stages 32 is maintained by the sliding movement of the plate 81 as described above due to the change in the amount of thermal expansion. In the coupled processing containers 5 of the third embodiment, in addition to the recesses 61A and 61B and the shafts 63 described above, by providing the bottom surface sliding part 8 to connect the bottom surfaces of the processing containers 31A and 31B, the tilting of the processing containers 31A and 31B is more reliably prevented.

In the third embodiment, even if the recesses 61A and 61B and the shafts 63 are not provided and only the bottom surface sliding part 8 is provided, it is possible to obtain each effect described in the first embodiment. Therefore, the connecting part that connects the processing containers 31A and 31B is not limited to being provided in the gap 30. That is, providing the connecting part across the gap 30 includes providing the connecting part in the gap 30 like the shaft 63 and providing the connecting part at a position deviating from the gap 30 like the plate 81.

As for the plate 81 of the third embodiment, for example, by using a plate having the same configuration as the plates 73 and 75 described in the second embodiment, it is possible to cause sliding to be smoothly performed, and to eliminate the need for oil feeding or to reduce the frequency of oil feeding. In addition, in each embodiment, for example, the top surface of the brackets 56 may be configured in the same manner as the plates 73 and 75 so that the nuts 58B slide smoothly. In this way, the configuration described with the plates 73 and 75 and the bushes 62 may be applied to each location where sliding occurs. In the third embodiment, the through hole through which the screw 82 provided in the plate 81 is inserted may be formed to be larger than the diameter of the screw 82. That is, the plate 81 may be configured to be slidable not only with respect to the bottom surface of the processing container 31B, but also with respect to the bottom surface of the processing container 31A.

In each of the above-described examples, the left end portion of the processing container 31A and the right end portion of the processing container 31B are supported by the support part bodies 55, respectively. However, the positions closer to the inside of the processing containers 31A and 31B than these ends may be supported. However, in order to secure a sufficiently large space below each of the processing containers 31A and 31B, it is preferable to support the sides opposite to the sides where the gap 30 is provided. The sides opposite to the sides where the gap 30 is provided are, for example, positions outside the positions of the centers P of the stages 32 in the left-right direction. That is, it is preferable to support the processing container 31A at the left side of the position of the center P by the support part body 55, and to support the processing container 31B at the right side of the position of the center P by the support part body 55. The sides where the gap 30 is provided are, for example, positions inside the positions of the centers P of the stages 32 in the left-right direction (positions closer to the center of the coupled processing containers 5 or 7), and it is preferable not to provide the support part body 55 at each of the inside positions.

The coupled processing containers 5 and 7 are not limited to being applied to a film forming module. For example, the coupled processing containers 5 and 7 are applicable to a module that performs vacuum processing on a wafer W, such as an etching module that supplies an etching gas to perform etching on a wafer W, and an annealing module that heats a wafer W while supplying an inert gas such as nitrogen gas. Although the illustrated film forming modules 3 are modules that do not perform plasma processing, the coupled processing containers 5 and 7 may be applied to processing modules that perform plasma processing. When plasma is formed and a process is performed, it is conceivable to perform the process such that the misalignment of the stages 32 and wafers W is compensated by adjusting, for example, the in-plane distribution of the plasma on the wafers W. However, when plasma is not formed, it is impossible to perform such an adjustment using plasma. Therefore, in a module such as the film forming module 3 in which plasma processing is not performed, the effect of suppressing the misalignment of wafers W in the coupled processing containers 5 is particularly effective.

It is conceivable that another substrate processing apparatus is provided outside the substrate processing system 1, and that the processing containers 31A and 31B are heated and thermally expanded due to the substrate processing apparatus as a heat source. Even in that case, with the coupled processing containers 5 and 7, it is possible to prevent the transport positions of wafers W from being deviated on the stages 32. That is, even if the processing containers 31A and 31B are not provided with a heater, it is possible to achieve the above-mentioned effects. Therefore, the processing containers 31A and 31B may be processing containers that are not provided with a heater and that are for performing vacuum processing on wafers W at room temperature. Further, the number of processing containers constituting coupled processing containers is not limited to two, and three or more processing containers may be connected to each other.

According to the present disclosure, it is possible to stably support processing containers connected to each other and to suppress the deviation of the transport positions of substrates due to thermal expansion.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. Coupled processing containers comprising:
   a first processing container and a second processing container provided side by side in a horizontal direction to form a gap therebetween, wherein the first processing container and the second processing container are configured to store substrates, respectively, to perform vacuum processing, the first processing container has a first stage on which one of the substrates is mounted, and the second processing container has a second stage on which another of the substrates is mounted; and
   a connector provided across the gap so as to connect the first processing container and the second processing container to each other, the connector being configured to be slidable in the horizontal direction with respect to at least one of the first processing container and the second processing container and to maintain a constant distance between the first stage and the second stage.

2. The coupled processing containers of claim 1, further comprising:
   a support part provided to support each of the first processing container and the second processing container at sides opposite to sides at which the gap is provided.

3. The coupled processing containers of claim 2, wherein the support part includes support part bodies that are connected to and support the first processing container and the second processing container, respectively, from below at the sides opposite the sides at which the gap is provided, and
   the support part bodies are not provided on the sides at which the gap is provided.

4. The coupled processing containers of claim 3, wherein the support part bodies comprise:
   support connection parts connected to the first processing container and the second processing container, respectively; and
   base parts configured to support the support connection parts, respectively, such that the support connection parts are slidable in front-rear direction and left-right direction.

5. The coupled processing containers of claim 4, wherein the support connection parts each include a first vertical shaft provided with a first flange,
   the base parts each include a hole, into which the first vertical shaft is inserted and which opens so as to support the first flange at an opening edge of the hole, and
   the hole has a diameter larger than a diameter of the first vertical shaft such that the first flange is slidable on the opening edge.

6. The coupled processing containers of claim 5, wherein the support part includes multiple columns surrounding a processing container set including the first processing container and the second processing container,
   the base parts extend toward a lower side of the first processing container from columns at a side of the first processing container among the multiple columns, and
   the base parts extend toward a lower side of the second processing container from columns at a side of the second processing container among the multiple columns.

7. The coupled processing containers of claim 6, wherein a side wall of the first processing container and a side wall of the second processing container are provided with first recesses, respectively, and
   the connector is inserted into each of the first recesses and is slidable with respect to each of the first recesses.

8. The coupled processing containers of claim 7, wherein the connector is a shaft member extending in the horizontal direction, and
   a peripheral wall of each of the first recesses is configured with a bearing including a solid lubricant.

9. The coupled processing containers of claim 8, wherein the connector connects a bottom surface of the first processing container and a bottom surface of the second processing container, and
   the coupled processing containers further comprise a bottom surface slider configured to be slidable with respect to at least one of the bottom surface of the first processing container and the bottom surface of the second processing container.

10. The coupled processing containers of claim 9, wherein the bottom surface slider includes:
    a connecting part body connected to each of the bottom surface of the first processing container and the bottom surface of the second processing container;
    a through hole provided in the connecting part body to open in one bottom surface among the bottom surface of the first processing container and the bottom surface of the second processing container;
    a second vertical shaft fixed to the one bottom surface and inserted into the through hole, the second vertical shaft having a diameter smaller than a diameter of the through hole; and
    a second flange provided on the second vertical shaft to support a hole edge of the through hole, and
    wherein the connecting part body is slidable on the one bottom surface and the second flange.

11. The coupled processing containers of claim 1, wherein a side wall of the first processing container and a side wall of the second processing container are provided with first recesses, respectively, and
    the connector is inserted into each of the first recesses and is slidable with respect to each of the first recesses.

12. The coupled processing containers of claim 1, wherein the connector connects a bottom surface of the first processing container and a bottom surface of the second processing container, and
    the coupled processing containers further comprise a bottom surface slider configured to be slidable with respect to at least one of the bottom surface of the first processing container and the bottom surface of the second processing container.

13. The coupled processing containers of claim 1, wherein a side wall of one of the first processing container and the second processing container is provided with a second recess, and
    the connector is a protrusion protruding from a side wall of a remaining one of the first processing container and the second processing container and inserted into the second recess, the protrusion being slidable with respect to the second recess.

14. The coupled processing containers of claim 13, wherein the second recess includes a lower contact part that is in contact with the protrusion from a lower side and has a height that is adjustable in the second recess, and
    the protrusion is slidable with respect to a top surface of the second recess and the lower contact part.

15. The coupled processing containers of claim 14, wherein the lower contact part and the top surface of the second recess include a solid lubricant.

16. A substrate processing system comprising:
    coupled processing containers including:
       a first processing container and a second processing container provided side by side in a horizontal direction to form a gap therebetween, wherein the first processing container and the second processing container are configured to store substrates, respectively, to perform vacuum processing, the first processing container has a first stage on which one of the substrates is mounted, and the second processing container has a second stage on which another of the substrates is mounted; and
       a connector provided across the gap so as to connect the first processing container and the second processing container to each other, the connector being configured to be slidable in the horizontal direction with respect to at least one of the first processing container and the second processing container and to maintain a constant distance between the first stage and the second stage;
    a vacuum transport chamber in which the substrates are transported, and which has a vacuum atmosphere and is connected to the coupled processing containers; and
    a transporter provided in the vacuum transport chamber so as to transport the substrates to the first processing container and the second processing container collectively.

17. A substrate processing method comprising:
    transporting and storing substrates in a first processing container and a second processing container collectively, the first processing container and the second processing container being provided side by side in a horizontal direction so as to form a gap therebetween, and processing each of the substrates in a vacuum atmosphere, wherein the first processing container has a first stage on which one of the substrates is mounted and the second processing container has a second stage on which another of the substrates is mounted; and
    causing a connector, which is provided across the gap so as to connect the first processing container and the second processing container to each other, to slide in the horizontal direction with respect at least one of the first processing container and the second processing container by thermal expansion of each of the first processing container and the second processing container, to thereby maintain a constant distance between the first stage and the second stage.

\* \* \* \* \*